(12) United States Patent
Li et al.

(10) Patent No.: US 10,388,673 B2
(45) Date of Patent: Aug. 20, 2019

(54) ARRAY SUBSTRATE, METHOD FOR MANUFACTURING THE SAME AND DISPLAY DEVICE INCLUDING THE ARRAY SUBSTRATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Dongzhao Li, Beijing (CN); Jingpeng Li, Beijing (CN); Jian Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/551,525

(22) PCT Filed: Apr. 1, 2017

(86) PCT No.: PCT/CN2017/079210
§ 371 (c)(1),
(2) Date: Aug. 16, 2017

(87) PCT Pub. No.: WO2017/206588
PCT Pub. Date: Dec. 7, 2017

(65) Prior Publication Data
US 2019/0088682 A1 Mar. 21, 2019

(30) Foreign Application Priority Data
Jun. 1, 2016 (CN) .......................... 2016 1 0382094

(51) Int. Cl.
G02F 1/1337 (2006.01)
H01L 27/12 (2006.01)
G02F 1/1362 (2006.01)

(52) U.S. Cl.
CPC .......... H01L 27/124 (2013.01); G02F 1/1337 (2013.01); G02F 1/1362 (2013.01);
(Continued)

(58) Field of Classification Search
CPC ........... G02F 1/134309; G02F 1/13458; G02F 1/136286
See application file for complete search history.

(56) References Cited

U.S. PATENT DOCUMENTS

2004/0239857 A1* 12/2004 Yoshikawa ......... G02F 1/13458
349/139
2006/0176437 A1 8/2006 Ota
(Continued)

FOREIGN PATENT DOCUMENTS

CN 1573477 A 2/2005
CN 1818748 A 8/2006
(Continued)

OTHER PUBLICATIONS

International Search Report and Written Opinion for Application No. PCT/CN2017/079210, dated Jun. 1, 2017, 9 Pages.
(Continued)

*Primary Examiner* — Daniel Whalen
(74) *Attorney, Agent, or Firm* — Brooks Kushman P.C.

(57) ABSTRACT

An array substrate, a method for manufacturing the same and a display device are provided. The array substrate includes an insulating layer and a conductive structure in the non-display region. The insulating layer includes at least one aperture in the non-display region. The aperture has a one-to-one correspondence with the conductive structure.
(Continued)

The conductive structure is within the aperture, and the surface of the conductive structure is lower than the surface of the insulating layer.

11 Claims, 3 Drawing Sheets

(52) U.S. Cl.
CPC .... *G02F 1/136286* (2013.01); *H01L 27/1248* (2013.01); *H01L 27/1262* (2013.01); *G02F 2001/136295* (2013.01)

(56) References Cited

U.S. PATENT DOCUMENTS

2010/0289997 A1* 11/2010 Suzuki ............... G02F 1/13458
349/158
2015/0226992 A1   8/2015 Ro et al.

FOREIGN PATENT DOCUMENTS

| CN | 202523709 U | 11/2012 |
| CN | 203084394 U | 7/2013 |
| CN | 104570493 A | 4/2015 |
| CN | 105206624 A | 12/2015 |
| CN | 105824162 A | 8/2016 |

OTHER PUBLICATIONS

First Office Action for Chinese Application No. 201610382094.2, dated Aug. 31, 2018, 7 Pages.

* cited by examiner

--Prior Art--

--Prior Art--

ARRAY SUBSTRATE, METHOD FOR MANUFACTURING THE SAME AND DISPLAY DEVICE INCLUDING THE ARRAY SUBSTRATE

CROSS-REFERENCE TO RELATED APPLICATION APPLICATIONS

This application is the U.S. national phase of PCT Application No. PCT/CN2017/079210 filed on Apr. 1, 2017, which claims priority to Chinese Patent Application No. 201610382094.2 filed on Jun. 1, 2016, the disclosures of which are incorporated in their entirety by reference herein.

TECHNICAL FIELD

The present disclosure relates to the field of display technology, and in particular, to an array substrate, a method for manufacturing the same and a display device.

BACKGROUND

At present, the thin film transistor liquid crystal display (TFT-LCD) has become the mainstream display product, and the display quality is optimized continuously with the development of the manufacture process technology. With the continuous improvement of the product quality requirements, the requirement for the production process is more and more.

The main structure of the TFT-LCD is a liquid crystal display panel, and the liquid crystal display panel includes an array substrate and a color film substrate that are oppositely arranged to form a cell, and liquid crystal filled between the array substrate and the color film substrate. In order to control the liquid crystal molecules to be correctly aligned, an alignment film is coated on the inner surface of the display region of the array substrate and the color film substrate, alignment grooves are formed on the alignment film by means of a friction alignment process to provide a pre-tilt angle for the liquid crystal molecules.

However, the friction alignment process in the related art has a problem of poor frictional alignment due to static electricity difference or the like.

SUMMARY

An array substrate, a method for manufacturing the same and a display device are provided according to the present disclosure, so as to solve the problem that the alignment film has poor frictional alignment due to static electricity difference.

In order to solve the above-mentioned technical problem, an array substrate is provided according to an embodiment of the present disclosure, which includes a display region and a non-display region at a periphery of the display region. The array substrate includes an insulating layer, the insulating layer includes at least one aperture that is in the non-display region. The array substrate further includes at least one conductive structure in the non-display region, the at least one aperture has a one-to-one correspondence with the at least one conductive structure, and the at least one conductive structure is within the at least one aperture.

For the above-described array substrate, optionally, the at least one conductive structure is made of a transparent conductive material.

For the above-described array substrate, optionally, the array substrate further includes gate lines and data lines for defining a plurality of pixel regions. The array substrate further includes a first metal line that is at the non-display region and in the same layer as the gate lines, and a second metal line that is at the non-display region and in the same layer as the data lines. The first metal line has a one-to-one correspondence with and is electrically connected to the second metal line. The first metal line and the second metal line have a one-to-one correspondence with and are electrically connected to the at least one conductive structure.

For the above-described array substrate, optionally, the array substrate further includes gate lines and data lines for defining a plurality of pixel regions. The array substrate further includes a first metal line that is at the non-display region and in the same layer as the gate lines, the first metal line has a one-to-one correspondence with and is electrically connected to the at least one conductive structure.

For the above-described array substrate, optionally, the array substrate further includes gate lines and data lines for defining a plurality of pixel regions. The array substrate further includes a second metal line that is at the non-display region and in the same layer as the data lines, the second metal line has a one-to-one correspondence with and is electrically connected to the at least one conductive structure.

For the above-described array substrate, optionally, the array substrate further includes a substrate; the insulating layer is at the non-display region on the substrate; and a height of the insulating layer is greater than a height of the at least one conductive structure by taking the substrate as a reference.

For the above-described array substrate, optionally, the array substrate further includes a groove in the insulating layer for mounting at least one of an integrated chip and a flexible circuit board, there is a plurality of apertures in the insulating layer, and the groove is in communication with the apertures.

A display device is further provided according to an embodiment of the present disclosure, which includes the array substrate above described.

For the above-described display device, optionally, the display device further includes at least one of a chip and a circuit board; the array substrate further includes a groove in the insulating layer for mounting at least one of the chip and the circuit board, there is a plurality of apertures in the insulating layer, and the groove is in communication with the plurality of apertures; pins of at least one of the chip and the circuit board are extended into the corresponding apertures and are in contact with the corresponding conductive structures within the corresponding apertures.

A method for manufacturing the above-described array substrate is further provided according to an embodiment of the present disclosure, the array substrate includes a display region and a non-display region at a periphery of the display region, the method includes: forming an insulating layer; forming at least one aperture in the insulating layer; and forming at least one conductive structure in the non-display region in such a manner that the at least one aperture has a one-to-one correspondence with the at least one conductive structure, and the at least one conductive structure is within the at least one aperture.

For the above-described method, optionally, the method specifically includes: forming the insulating layer; forming the at least one aperture in the insulating layer; and forming the at least one conductive structure within the at least one aperture.

For the above-described method, optionally, the method specifically includes: forming the at least one conductive structure; forming the insulating layer on the at least one conductive structure; and forming the at least one aperture in the insulating layer.

For the above-described method, optionally, the at least one conductive structure is made of a transparent conductive material.

For the above-described method, optionally, the array substrate further includes a substrate, the forming the insulating layer includes: forming the insulating layer at the non-display region on the substrate.

For the above-described method, optionally, the forming at least one conductive structure in the non-display region includes: forming the at least one conductive structure in the non-display region on the substrate in such a manner that a height of the insulating layer is greater than a height of the at least one conductive structure by taking the substrate as a reference.

The above-described technical solution of the present disclosure has advantageous effects as follows.

In the above-described technical solution, the array substrate includes the insulating layer and the conductive structure in the non-display region, the insulating layer includes at least one aperture in the non-display region, the aperture has a one-to-one correspondence with the conductive structure, the conductive structure is within the aperture so that the surface of the conductive structure is lower than the surface of the insulating layer. Therefore, in the process of frictional alignment of the alignment film, a rubbing cloth is not in contact with the conductive material, all material in contact with the rubbing cloth is the insulating material, there is no difference in the static electricity generated by high-speed friction, and there is no difference in the influence applied by the static electricity on hairs of the rubbing cloth, thereby ensuring the quality of the frictional alignment and improving the picture quality.

BRIEF DESCRIPTION OF THE DRAWINGS

In order to explain the technical solutions in embodiments of the present disclosure or in the related art more clearly, accompanying drawings needed in the description of the embodiments or the related art are briefly illustrated hereinafter. Apparently, the accompanying drawings described hereinafter show only some embodiments of the present disclosure, and those skilled in the art may further conceive other drawings according to the drawings without creative work.

DETAILED DESCRIPTION

Figure 1:
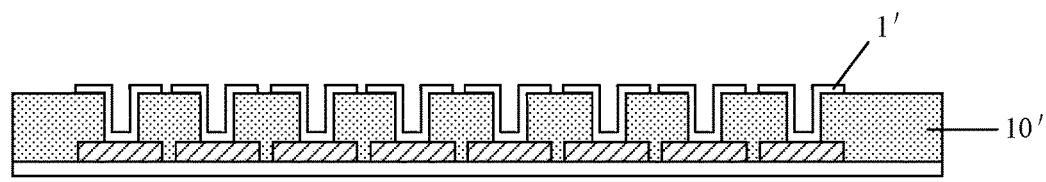
FIG. 1 is a partial section view of a terminal region of an array substrate in the related art.
Figure 2:
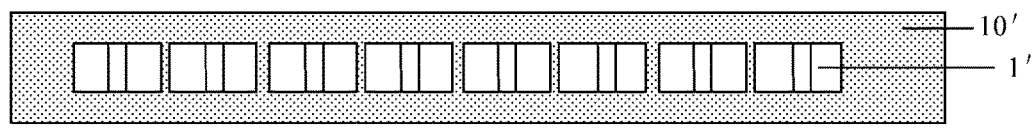
FIG. 2 is a partial top view of the terminal region of the array substrate in the related art.

FIG. 1 is a partial section view of a terminal region of an array substrate in the related art. FIG. 2 is a partial top view of the terminal region of the array substrate in the related art. Referring to FIG. 1 and FIG. 2, the array substrate includes a protective layer 10' and a terminal 1' which are at a non-display region. The protective layer 10' is made of an insulating material and the terminal 1' is made of a conductive material, therefore, in the process of frictional alignment of an alignment film, difference exists in the static electricity generated by high-speed friction. Difference exists in the influence on hairs of the rubbing cloth due to the static electricity difference, which may cause the hairs to be disorderly and cause directions of hairs where the protective layer 10' is connected to the terminals 1' to be non-uniform, thereby directly causing poor friction and affecting the picture quality.

An array substrate, a method for manufacturing the same and a display device are provided according to the present disclosure, in order to solve the problem that the alignment film has poor frictional alignment due to static electricity differences. Specific embodiments of the present disclosure are described hereinafter in details in conjunction with the drawings and embodiments. The following embodiments are used to illustrate the present disclosure, but not limit the scope of the present disclosure.

Referring to FIG. 3 to FIG. 6, an array substrate is provided according to an embodiment of the present disclosure. The array substrate includes a display region 210 (shown in FIG. 9) and a non-display region 220 (shown in FIG. 9) at the periphery of the display region. The array substrate further includes a substrate 100 and at least one conductive structure 1 in the non-display region arranged on the substrate 100. The conductive structure is generally made of a transparent conductive material, because the transparent conductive material is not easily subject to oxidation compared with a metal material. The conductive structure 1 may be formed in the same layer as pixel electrodes or common electrodes, to simplify the manufacturing process and reduce cost.

The array substrate includes an insulating layer 11 arranged on the substrate 100. The insulating layer 11 includes at least one aperture 12 in the non-display region. Positions of the apertures 12 are corresponding to positions of the conductive structures 1 in a one-to-one manner. The conductive structure 1 is located within the corresponding aperture 12 in such a manner that a surface of the conductive structure 1 away from the substrate 100 is closer to the substrate 100 compared with a surface of the insulating layer 11 away from the substrate 100.

For the above-described array substrate, the conductive structure 1 is located within the corresponding aperture 12 in such a manner that a top surface 930 of the conductive structure 1 away from the substrate 100 is closer to the substrate 100 compared with a top surface 940 of the insulating layer 11 away from the substrate 100, that is, the top surface of the conductive structure 1 is lower than the top surface of the insulating layer 11. In other words, the height of the insulating layer 11 is greater than the height of the conductive structure 1 by taking the substrate 100 as a reference. Therefore, in the process of frictional alignment of an alignment film, a rubbing cloth is not in contact with the conductive material, which refers to the conductive structure 1, and all material in contact with the rubbing cloth is the insulating material which refers to the insulating layer 11. Thus, there is no difference in the static electricity generated by high-speed friction, and there is no difference in the influence applied by the static electricity on hairs of the rubbing cloth, thereby ensuring the quality of the frictional alignment and improving the picture quality.

The array substrate further includes various display film structures in the display region, such as gate lines 950, data lines 960 and pixel electrodes 970. The gate lines and the data lines are used for defining multiple pixel regions 980. The pixel electrode is included in each of the pixel regions. An electric flied for driving liquid crystal molecules to be deflected is formed between the pixel electrodes and common electrodes. The alignment film is used to align the liquid crystal molecules to control the liquid crystal molecules to be arranged regularly. The common electrodes may be arranged on the array substrate, or may also be arranged on the color film substrate. When the common electrodes are arranged on the array substrate, the conductive structure 1 may be formed in the same layer as the common electrodes to simplify the manufacturing process. When the common electrodes are arranged on the color film substrate, the conductive structure 1 may be formed in the same layer as the pixel electrodes to simplify the manufacturing process. Additionally, the conductive structure 1 is made of a transparent conductive material, which is not easily subject to oxidation when being exposed outside.

In order to reduce transmission resistance, in the embodiment, a first metal line 2 arranged in the same layer as the gate lines and/or a second metal line 3 arranged in the same layer as the data lines are further included in the non-display region of the array substrate, for transmitting signals. In the array substrate shown in FIG. 3 and FIG. 5, the array substrate further includes the first metal line 2 and the second metal line 3 in the non-display region, the first metal line 2 has a one-to-one correspondence with and is electrically connected to the second metal line 3. An insulating layer 10 is formed between the first metal line 2 and the second metal line 3, and the first metal line 2 is electrically connected to the second metal line 3 through a via hole 102 in the insulating layer 10. The first metal line 2 and the second metal line 3 have a one-to-one correspondence with and are electrically connected to the conductive structure 1. In the array substrate shown in FIG. 4 and FIG. 6, the array substrate includes only one of the first metal line 2 and the second metal line 3 in the non-display region of the array substrate. For example, only one of the first metal line 2 and the second metal line 3, i.e., the first metal line 2, is included in the non-display region of the array substrate, and the first metal line has a one-to-one correspondence with and is electrically connected to the conductive structure. In other embodiments, only one of the first metal line 2 and the second metal line 3, i.e., the second metal, is included in the non-display region of the array substrate, which is similar to FIG. 4 and FIG. 6 and is not shown any more. The gate lines and the data lines are made of metal materials, such as Cu, Al, Ag, Mo, Cr, Nd, Ni, Mn, Ti, Ta, W, or their alloy materials, which have less transmission resistance, thereby reducing power consumption.

Figure 3:
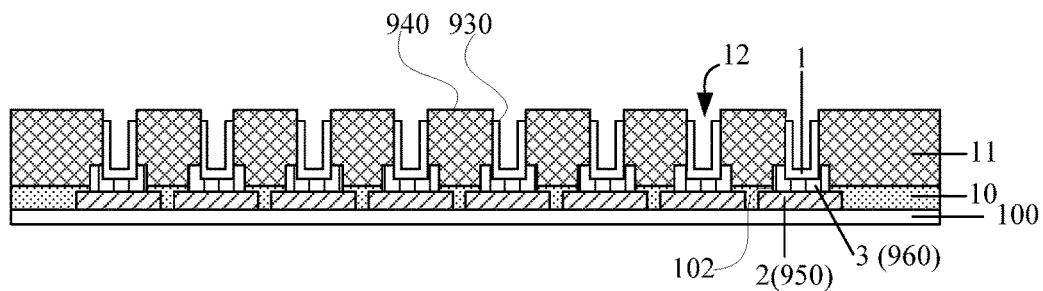
FIG. 3 is a first partial section view of an array substrate according to an embodiment of the disclosure.
Figure 4:
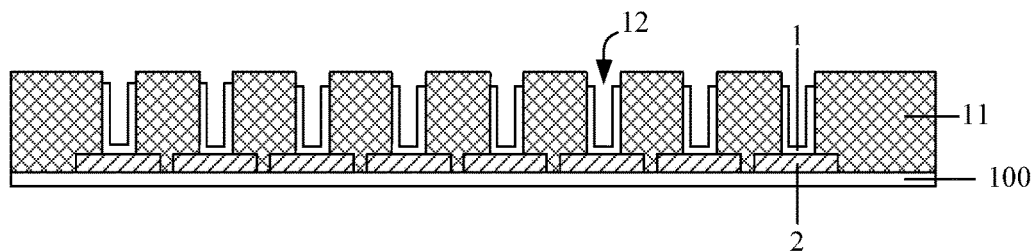
FIG. 4 is a second partial section view of an array substrate according to an embodiment of the disclosure.
Figure 5:
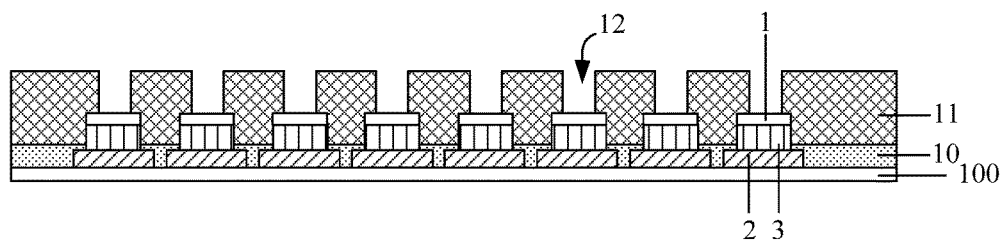
FIG. 5 is a third partial section view of an array substrate according to an embodiment of the disclosure.
Figure 6:
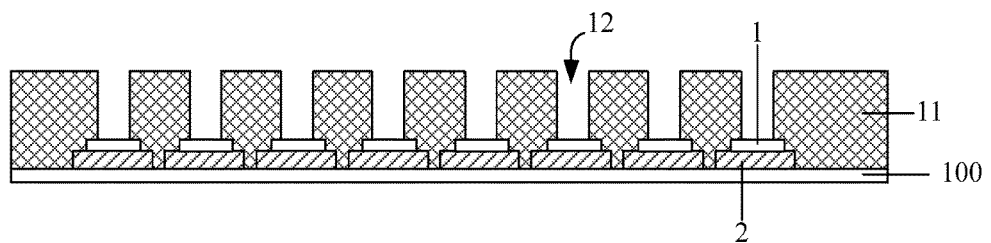
FIG. 6 is a fourth partial section view of an array substrate according to an embodiment of the disclosure.

In the technical solution of the present disclosure, the problem of poor frictional alignment due to static electricity difference is solved by the presence of the insulating layer 11 as well as positioning the conductive structure 1 within the aperture 12 in the insulating layer 11. One specific implementation mode may include: forming the aperture 12 in the insulating layer 11, and then forming the conductive structure 1 by providing a transparent conductive material in the aperture 12. That is, the conductive structure 1 is filled into the aperture 12, and the surface of the conductive structure 1 is lower than the surface of the insulating layer 11, as shown in FIG. 3 and FIG. 4. Alternatively, the insulating layer 11 for covering the conductive structure 1 may be formed after the conductive structure 1 is formed, and then the aperture 12 is formed in the insulating layer 11 to expose the conductive structure 1, that is, the insulating layer 11 is arranged on the conductive structure 1, as shown in FIG. 5 and FIG. 6.

Figure 7:
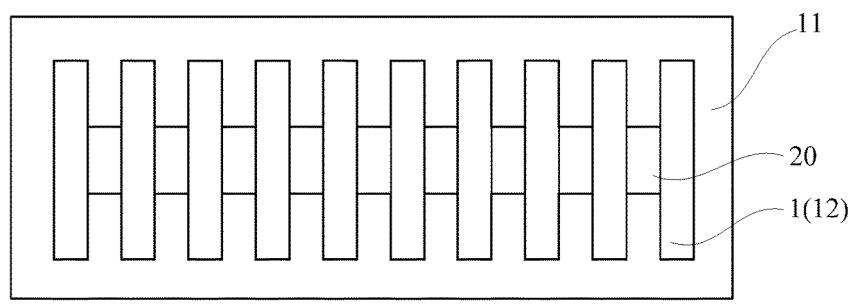
FIG. 7 is a partial top view of a terminal region of an array substrate according to an embodiment of the disclosure.
Figure 8:
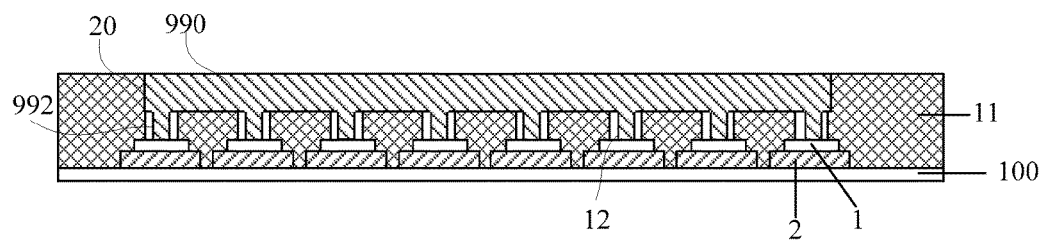
FIG. 8 is a schematic diagram of a connection relationship between a circuit board and an array substrate according to an embodiment of the disclosure.

It should be noted that, the technical solution of the present disclosure is suitable for all conductive structures needed to be exposed outside in the non-display region, for example, as shown in FIG. 8, a conductive structure connected to an integrated chip or a flexible circuit board 990, positions of the conductive structures 1 have a one-to-one correspondence with positions of pins 992 of the integrated chip or the flexible circuit board 990. Since the conductive structure 1 is located within the aperture 12 of the insulating layer 11, a groove 20 may be formed in the insulating layer 11, so as to facilitating installation of the integrated chip and the flexible circuit board, as shown in FIG. 7 and FIG. 8. The groove 20 is matched with the integrated chip and the flexible circuit board in shape, the groove 20 is in communication with the apertures. When the integrated chip and the flexible circuit board are placed in the groove 20, the pins 992 of the integrated chip and the flexible circuit board are inserted in the corresponding apertures 12 and in contact with the conductive structures 1, thereby achieving installation of the integrated chip and the flexible circuit board.

Figure 9:
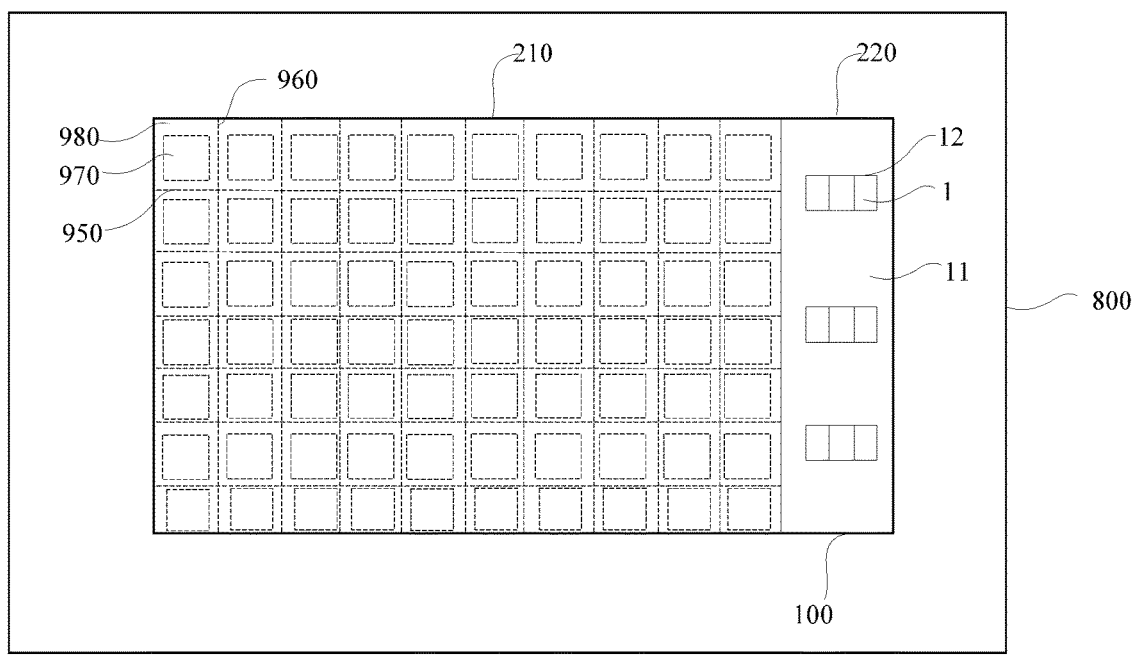
FIG. 9 is a schematic diagram of a display device according to an embodiment of the disclosure.

A display device 800 is further provided according to some embodiments of the present disclosure, as shown in FIG. 9, which includes the above-described array substrate, in order to improve the frictional alignment quality of the alignment film and improve the display quality.

The display device may be any product or component having a display function such as a liquid crystal display panel, an electronic paper, a mobile phone, a tablet computer, a television set, a display, a notebook computer, a digital photo frame, or a navigator.

A method for manufacturing the above-described array substrate is further provided according to some embodiments of the present disclosure. The array substrate includes a display region and a non-display region at the periphery of the display region. The method includes: forming an insulating layer; forming at least one aperture in the non-display region in the insulating layer with the at least one aperture having a one-to-one correspondence with the at least one conductive structure that is within the at least one aperture.

For the array substrate manufactured by the above-described steps, the conductive structure is located within the aperture of the insulating layer, therefore, in the process of frictional alignment of the alignment film, a rubbing cloth is not in contact with the conductive material, all material in contact with the rubbing cloth is the insulating material, there is no difference in the static electricity generated by high-speed friction, and then there is no difference in the influence applied by the static electricity on hairs of the rubbing cloth, thereby ensuring the quality of the frictional alignment and improving the picture quality.

In order to achieve the above object, the insulating layer is formed before the alignment film is frictionally aligned. Specifically, the aperture may be formed before the alignment film is frictionally aligned, or the aperture may be formed after the alignment film is frictionally aligned.

Optionally, the conductive structure is formed of a transparent conductive material (such as Indium zinc oxide, Indium Tin Oxide) to improve the oxidative stability of the conductive structure. Further, when the common electrodes are arranged on the array substrate, the conductive structure and the common electrodes are formed by performing a patterning process on an identical transparent conductive layer to simplify the fabrication process. When the common electrodes are arranged on the color film substrate, the conductive structure and the pixel electrodes are formed by performing a patterning process on an identical transparent conductive layer, to simplify the fabrication process.

In a particular embodiment, referring to FIG. 3 and FIG. 4, the method for manufacturing the array substrate specifically includes: forming the insulating layer 11; forming the aperture 12 in the insulating layer 11; and forming the conductive structure 1 within the aperture 12.

In the above steps, firstly the insulating layer is formed and the aperture is formed in the insulating layer, then a conductive material is filled into the aperture to form the conductive structure in such a manner that a top surface 930 of the conductive structure 1 away from the substrate 100 is closer to the substrate 100 compared with a top surface 940 of the insulating layer 11 away from the substrate 100, that is, the top surface 930 of the conductive structure 1 is lower than the top surface 940 of the insulating layer 11. Therefore, when the alignment film is frictionally aligned, the rubbing cloth is not in contact with the conductive structure, thereby overcoming the problem of poor frictional alignment due to static electricity difference.

In another particular embodiment, referring to FIG. 5 and FIG. 6, the method for manufacturing the array substrate specifically includes: forming the conductive structures 1; forming the insulating layer 11 on the conductive structure 1; and forming the apertures 12 in the insulating layer 11 in such a manner that the apertures 12 have a one-to-one correspondence with the conductive structures 1 to expose the corresponding conductive structures 1.

In the above steps, firstly the conductive structure is formed, then the insulating layer is formed and the apertures are formed in the insulating layer to expose the conductive structure. Since the surface of the conductive structure is lower than the surface of the insulating layer, the rubbing cloth is not in contact with the conductive structure when the alignment film is frictionally aligned, thereby overcoming the problem of poor frictional alignment due to static electricity difference.

In the above two particular embodiments, the formed conductive structure is exposed outside through the aperture in the insulating layer, and the rubbing cloth is not in contact with the conductive structure in the process of frictional alignment of the alignment film due to the presence of the insulating layer, thereby overcoming the problem of poor frictional alignment due to static electricity difference. Optionally, the aperture is formed before the alignment film is frictionally aligned, to prevent the alignment of the alignment film from being affected by the manufacturing process of the aperture. Additionally, in the particular embodiment shown in FIG. 3 and FIG. 4, a mask is omitted when the conductive structure is formed, thereby reducing fabrication cost.

It is to be understood that several embodiments described in the specification are merely used to illustrate and explain the present disclosure, but are not intended to limit the present disclosure. The embodiments and characteristics in the embodiments of the present disclosure may be combined with each other without conflict.

The forgoing descriptions are only optional embodiments of the present disclosure, and it should be noted that numerous improvements and substitutions may further be made by those skilled in the art without being departing from the principle of the present disclosure, and those improvements and substitutions shall fall into the scope of protection of the present disclosure.

What is claimed is:

1. An array substrate comprising: a display region and a non-display region at a periphery of the display region,
   wherein the array substrate comprises an insulating layer with at least one aperture defined in the insulating layer at the non-display region,
   wherein the array substrate further comprises at least one conductive structure at the non-display region, the at least one aperture has a one-to-one correspondence with the at least one conductive structure, and the at least one conductive structure is within the at least one aperture;
   wherein the array substrate further comprises gate lines and data lines for defining a plurality of pixel regions,
   wherein the array substrate further comprises a first metal line that is at the non-display region and in the same layer as the gate lines, and a second metal line that is at the non-display region and in the same layer as the data lines, the first metal line has a one-to-one correspondence with and is electrically connected to the second metal line; and
   wherein the first metal line and the second metal line have a one-to-one correspondence with and are electrically connected to the at least one conductive structure.

2. The array substrate according to claim 1, wherein the at least one conductive structure is made of a transparent conductive material.

3. The array substrate according to claim 1, wherein the array substrate further comprises a substrate; the insulating layer is at the non-display region on the substrate; and a height of the insulating layer is greater than a height of the at least one conductive structure by taking the substrate as a reference.

4. The array substrate according to claim 3, wherein the array substrate further comprises a groove in the insulating layer for mounting at least one of an integrated chip and a flexible circuit board, there is a plurality of apertures in the insulating layer, and the groove is in communication with the apertures.

5. A display device comprising: the array substrate according to claim 3.

6. The display device according to claim 5, wherein the display device further comprises at least one of a chip and a circuit board;
   wherein the array substrate further comprises a groove in the insulating layer for mounting at least one of the chip and the circuit board, there is a plurality of apertures in the insulating layer, and the groove is in communication with the plurality of apertures;
   wherein pins of at least one of the chip and the circuit board are extended into the corresponding apertures and are in contact with corresponding conductive structures within the corresponding apertures.

7. A method for manufacturing the array substrate according to claim 1, the array substrate comprising the display region and the non-display region at the periphery of the display region, the method comprising:
   forming the insulating layer;
   forming the at least one aperture in the insulating layer; and forming the at least one conductive structure in the non-display region in such a manner that the at least one aperture has the one-to-one correspondence with the at least one conductive structure, and the at least one conductive structure is within the at least one aperture.

8. The method according to claim 7, wherein the at least one conductive structure is made of a transparent conductive material.

9. The method according to claim 7, wherein the array substrate further comprises a substrate, the forming the insulating layer comprises: forming the insulating layer at the non-display region on the substrate.

10. The method according to claim 9, wherein the forming at least one conductive structure in the non-display region comprises: forming the at least one conductive structure in the non-display region on the substrate in such a manner that a height of the insulating layer is greater than a height of the at least one conductive structure by taking the substrate as a reference.

11. A method for manufacturing the array substrate according to claim 1, wherein the method comprises:
   forming the at least one conductive structure;
   forming the insulating layer on the at least one conductive structure; and
   forming the at least one aperture in the insulating layer.

* * * * *